United States Patent
Lee et al.

(10) Patent No.: US 9,502,378 B1
(45) Date of Patent: Nov. 22, 2016

(54) PRINTED CIRCUIT BOARDS HAVING BLIND VIAS, METHOD OF TESTING ELECTRIC CURRENT FLOWING THROUGH BLIND VIA THEREOF AND METHOD OF MANUFACTURING SEMICONDUCTOR PACKAGES INCLUDING THE SAME

(71) Applicant: SK hynix Inc., Icheon-si Gyeonggi-do (KR)

(72) Inventors: Ki Yong Lee, Seoul (KR); Jong Hyun Kim, Seoul (KR); Hyung Ju Choi, Seoul (KR)

(73) Assignee: SK HYNIX IONC., Icheon-Si (KR)

( * ) Notice: Subject to any disclaimer, the term of this patent is extended or adjusted under 35 U.S.C. 154(b) by 0 days.

(21) Appl. No.: 14/938,322

(22) Filed: Nov. 11, 2015

(30) Foreign Application Priority Data

May 29, 2015 (KR) ........................ 10-2015-0076393

(51) Int. Cl.
| | |
|---|---|
| G01R 31/26 | (2014.01) |
| H01L 21/66 | (2006.01) |
| H01L 23/00 | (2006.01) |
| H05K 1/11 | (2006.01) |
| H05K 1/02 | (2006.01) |
| G01R 31/28 | (2006.01) |

(52) U.S. Cl.
CPC .......... *H01L 24/85* (2013.01); *G01R 31/2806* (2013.01); *H01L 22/14* (2013.01); *H01L 22/32* (2013.01); *H01L 24/05* (2013.01); *H01L 24/48* (2013.01); *H05K 1/0298* (2013.01); *H05K 1/115* (2013.01); *H01L 2224/04042* (2013.01); *H01L 2224/05025* (2013.01); *H01L 2224/48227* (2013.01); *H05K 2201/09545* (2013.01)

(58) Field of Classification Search
CPC ..................... H01L 21/2007; H01L 21/76816; H01L 23/3114; H01L 23/488; H01L 23/53219; H01L 24/48; H01L 24/85; H05K 1/115; G01R 31/2806; G01R 31/309; G01R 31/317

USPC .......... 438/14, 15, 106, 113, 118, 460, 672; 257/E21.122, E21.175, E21.499, 257/E21.505, E21.509, E21.521
See application file for complete search history.

(56) References Cited

U.S. PATENT DOCUMENTS

| | | | | |
|---|---|---|---|---|
| 7,081,590 B2* | 7/2006 | Yuzawa | ............. | H01L 23/4985 174/250 |
| 7,402,755 B2* | 7/2008 | Chen | .................... | H05K 1/0269 174/250 |
| 8,430,969 B2* | 4/2013 | Gerber | ................ | H01L 23/3128 134/19 |
| 8,551,820 B1* | 10/2013 | Foster | ..................... | H01L 24/97 438/123 |

FOREIGN PATENT DOCUMENTS

KR 100886716 B1 2/2009

* cited by examiner

*Primary Examiner* — David Nhu
(74) *Attorney, Agent, or Firm* — William Park & Associates Ltd.

(57) ABSTRACT

A method of manufacturing a semiconductor package is provided. The method includes providing a strip substrate having a plurality of unit substrate regions that are spaced apart from each other by a periphery region and have blind vias, a peripheral conductive pattern layer disposed in the periphery region, and a connection pattern layer electrically connecting the blind vias to the peripheral conductive pattern layer. Semiconductor chips are disposed on the plurality of unit substrate regions, respectively. Conductive wires are formed to electrically connect connection pads disposed on the plurality of unit substrate regions to bonding pads disposed on the semiconductor chips. The connection pads are electrically connected to the blind vias, and forming the conductive wires includes performing a test for confirming a current that flows between each conductive wire and the peripheral conductive pattern layer through the unit substrate region.

17 Claims, 11 Drawing Sheets

PRINTED CIRCUIT BOARDS HAVING BLIND VIAS, METHOD OF TESTING ELECTRIC CURRENT FLOWING THROUGH BLIND VIA THEREOF AND METHOD OF MANUFACTURING SEMICONDUCTOR PACKAGES INCLUDING THE SAME

CROSS-REFERENCE TO RELATED APPLICATION

The present application claims priority under 35 U.S.C. 119(a) to Korean Application No. 10-2015-0076393 filed on May 29, 2015, in the Korean intellectual property Office, which is incorporated herein by reference in its entirety.

BACKGROUND

1. Technical Field

Various embodiments of the present disclosure generally relate to a packaging technology and, more particularly to printed circuit boards (PCBs) having blind vias, method of testing electric current flowing through the blind via and method of manufacturing semiconductor packages including the same.

2. Related Art

A semiconductor package manufacturing process involves mounting semiconductor chips on a package substrate such as printed circuit board (hereinafter referred to as "PCB"), electrically connecting the semiconductor chips to the PCB, and encapsulating the semiconductor chips through a molding process. This packaging process may be performed on a strip substrate including a plurality of unit substrate regions to improve productivity. The plurality of unit substrate regions of the strip substrate may be separated from each other by using a sawing process to produce a plurality of unit packages.

SUMMARY

According to an embodiment, there is provided a method of manufacturing a semiconductor package. The method includes providing a strip substrate having a plurality of unit substrate regions that are spaced apart from each other by a periphery region and are disposed to have blind vias, a peripheral conductive pattern layer disposed in the periphery region, and a connection pattern layer electrically connecting the blind vias to the peripheral conductive pattern layer. Semiconductor chips are mounted on the plurality of unit substrate regions, respectively. Conductive wires are formed to electrically connect connection pads disposed on the plurality of unit substrate regions to bonding pads disposed on the semiconductor chips. The connection pads are electrically connected to the blind vias, and forming the conductive wires includes performing a test for confirming a current that flows between each conductive wire and the peripheral conductive pattern layer through the unit substrate region.

According to another embodiment, there is provided a method of testing a printed circuit board. The method includes providing a strip substrate having a plurality of unit substrate regions that are spaced apart from each other by a periphery region, a peripheral conductive pattern layer disposed in the periphery region, and a connection pattern layer electrically connecting the peripheral conductive pattern layer to at least one blind via included in each of the plurality of unit substrate regions. A test for confirming a current flowing through each of the blind vias is performed by applying a power supply voltage between circuit wires connected to the blind vias and disposed in the unit substrate regions. The peripheral conductive pattern layer is connected to the blind vias of the plurality of unit substrate regions in common. Performing the test includes performing an electric current test for confirming a current flowing through the at least one blind via included in any one of the plurality unit substrate regions and sequentially performing the electric current test to the remaining unit substrate regions.

According to another embodiment, there is provided a printed circuit board. The printed circuit board includes a strip substrate and a plurality of unit substrate regions disposed in the strip substrate to be spaced apart from each other by a periphery region. Each of the plurality of unit substrate regions includes at least one blind via. A common electrode pattern layer is disposed in the periphery region. A connection pattern layer is embedded in the strip substrate to electrically connect the at least one blind via included in each of the plurality of unit substrate regions to the common electrode pattern layer.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

Figure 1:
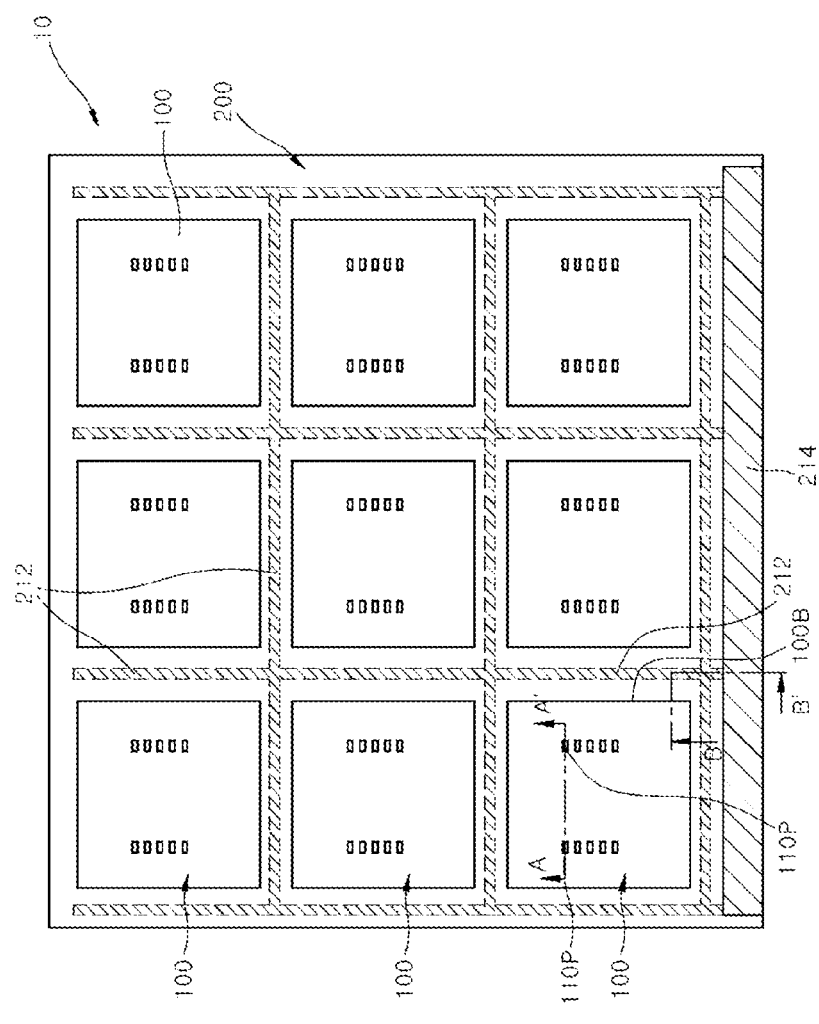
FIG. 1 is a plan view schematically illustrating a printed circuit board including a plurality of unit substrate regions according to an embodiment.

Various embodiments will now be described more fully hereinafter with reference to the accompanying drawings. However, they may be embodied in different forms and should not be construed as limited to the embodiments set forth herein. Rather, these embodiments are provided so that this disclosure will be thorough and complete, and will fully convey the scope of the present disclosure to those skilled in the art. In the drawings, the width or thickness of the component are shown in slightly enlarged in order to clarify the components of each device. Overall, the drawings were described in the observer's view point. It will also be understood that when an element is referred to as being located on the other element, it may directly contact the other element, or at least one intervening element may be present therebetween.

In the drawings, same reference numerals refer to same elements. Also, expression in the singular form should be understood to include a plurality of expressions unless it has a clearly different meaning in the specification, and the term "include" or "have" is intended to designate that features, numbers, steps, operations, elements, components or combinations thereof are present. It should be understood not to preclude the presence or possibility of addition of the features, numbers, steps, operations, elements, components or combinations thereof.

In addition, carrying out the method or the fabricating method, each step constituting the method may be performed in a different order stated unless explicitly described to a certain sequence context. That is, each process may also performed in the same manner as specified order and may be performed substantially simultaneously, and the case in which may be performed in the reverse order is not excluded.

Generally, semiconductor chips or semiconductor packages related to various electronic devices can be mounted on a surface of the printed circuit board or disposed inside the printed circuit board. The printed circuit board may exchange the electrical signals with the semiconductor chips or the semiconductor packages by interconnection means such as bumps or wires and, can supply a power from the external systems to the semiconductor chips or the semiconductor packages. These printed circuit boards may be fabricated in a type of a plurality of unit substrates on the strip substrate according to the specification rule of the products or request of customer.

Figure 2:
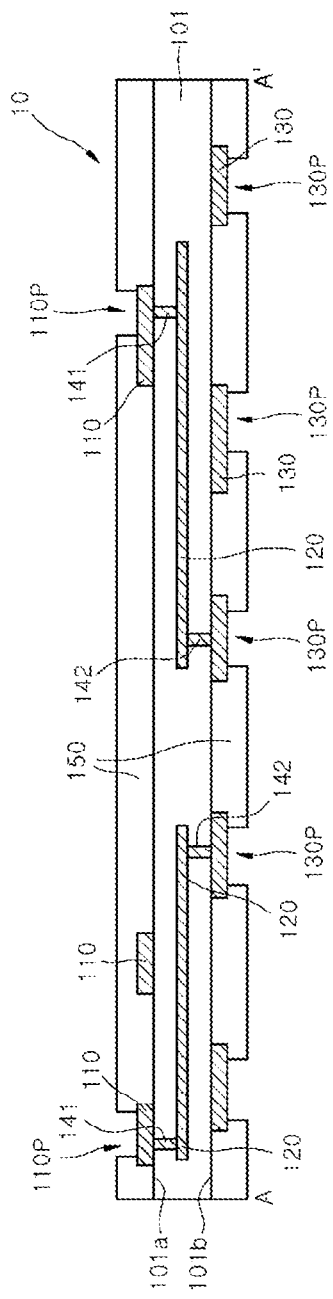
FIG. 2 is a cross-sectional view taken along a line A-A' of FIG. 1.
Figure 3:
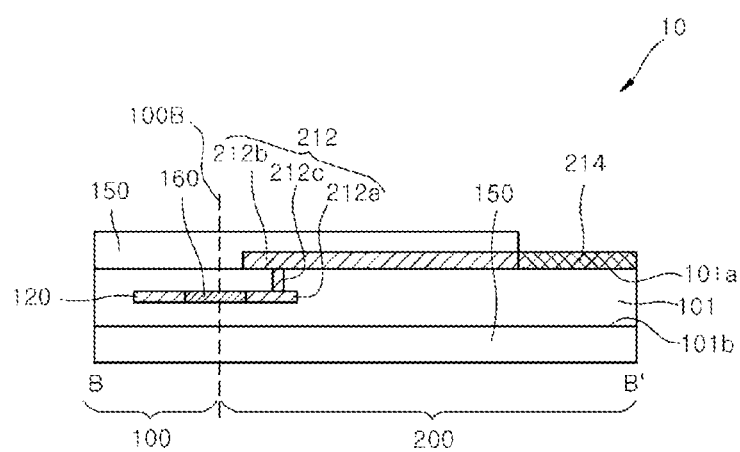
FIG. 3 is a cross-sectional view taken along a line B-B' of FIG. 1.

FIG. 1 is a plan view schematically illustrating a printed circuit board including a plurality of unit substrate regions according to an embodiment. FIG. 2 is a cross-sectional view taken along the A-A' line of the printed circuit board of FIG. 1. FIG. 3 is a cross-sectional view taken along the B-B' line of the printed circuit board of FIG. 1

Referring to FIG. 1, the printed circuit board 1 may include a strip substrate 10 having a plurality of unit substrate regions 100 and a periphery region 200 thereon. The strip substrate 10 may be a raw substrate that the manufacturing process of the printed circuit board is substantially carried out thereon.

The unit substrate regions 100 may be disposed spaced apart from each other by interposing the peripheral region 200 therebetween. As an example in the drawings, it is illustrated that the strip substrate 10 has nine unit substrate regions 100, but it is not necessarily limited thereto. The strip substrate 10 may have a different number of unit substrate regions.

The unit substrate region 100 may be a region where external devices like semiconductor chips are mounted, and where various circuit patterns exchanging the electrical signals with the external devices are formed. First connection pads 110P for electrically connecting to the external devices may be disposed on an upper surface of the strip substrate 10 of the unit substrate region 100. Although it is not illustrated in the drawings, second connection pads for electrically connecting to other external devices or systems may be disposed on a bottom surface of the strip substrate 10 of the unit substrate region 100.

The periphery region 200 may mean the strip substrate 10 except an area that the unit substrate regions 100 occupy. In the drawings, a boundary 100B represents a boundary between the unit substrate regions 100 and the periphery region 200. Peripheral conductive pattern layers 212 and a conductive test pattern layer 214 may be disposed over the periphery region 200. The peripheral conductive pattern layers 212 may surround the unit substrate region 100. Each of the peripheral conductive pattern layers 212 may be a metal pattern layer like copper (Cu). In an embodiment, the peripheral conductive pattern layer 212 may be employed as a plating electrode when an electroplating process to form a circuit layer on the strip substrate 10 is carried out during the printed circuit board manufacturing process.

The conductive test pattern layer 214 may be disposed on an end portion of the strip substrate 10 and may be electrically connected to the peripheral conductive pattern layers 212. The conductive test pattern layer 214 may be a mold gate pattern. In an embodiment, the mold gate pattern may be used to easily remove the remaining parts of the molding member when the package molding process is carried out on the strip substrate 10. The conductive test pattern layers 214 may have a sufficiently large area to be employed as a pad member for bringing the conductive test pattern layers 214 into contact with an external probe in an electric current test process.

Referring to FIG. 2, the strip substrate 10 of the unit substrate region (e.g., 100 of FIG. 1) may include circuit pattern layers 110, 120 and 130. First external circuit pattern layers 110 may be disposed on a first surface 101a of an insulation layer 101. A portion of the first outer circuit pattern layer 110 may be selectively exposed by a protection pattern layers 150 and may form the first connection pads 110P. The first connection pads 110P may be disposed on the first surface 101a of the insulation layer 101. Inner circuit pattern layers 120 may be disposed in the insulation layer 101. Second outer circuit pattern layers 130 may be disposed on a second surface 101b of the insulation layer 101. A portion of the second outer circuit pattern layer 130 may be selectively exposed by the protection pattern layers 150 and may form second connection pads 130P. The second connection pads 130P may be disposed on the second surface 101b of the insulation layer 101.

First blind vias 141 may be disposed between the first outer circuit pattern layers 110 and the inner circuit pattern layers 120, and second blind vias 142 may be disposed between the inner circuit pattern layers 120 and the second outer circuit pattern layers 130. The first blind vias 141 and the second blind vias 142 may be electrically connected to each other through the inner circuit pattern layers 120. Accordingly, an electrical path may be formed from the first connection pad 110P to the second connection pad 130P through the first blind via 141, the inner circuit pattern layer 120, and the second blind via 142.

Although it is illustrated in FIG. 2 that circuit pattern layers 110, 120 and 130 are vertically stacked to form a layered structure, it is not limited thereto. According to an embodiment of the present disclosure, the strip substrate 10 may be a printed circuit board having circuit pattern layers of at least three layers that can constitute the blind vias. In this case, each connection pad exposed on the opposite surface may be electrically connected to each other by the blind via and the inner circuit pattern layer.

FIG. 3 illustrates the cross-sectional structure of the strip substrate 10 in the boundary area of the unit substrate region 100 and the periphery region 200. The boundary 100B is illustrated to make the unit substrate region 100 and the periphery region 200 easily distinguishable in the drawings.

Referring to FIGS. 2 and 3 together, the inner circuit pattern layer 120 may be disposed in the unit substrate region 100. As described above, the inner circuit pattern layer 120 may be electrically connected to the connection pads 110P and 130P, which are disposed on the upper surface 101a and the bottom surface 101b of the insulation layer 101, through the blind vias 141 and 142. As illustrated in FIG. 3, the inner circuit pattern layer 120 may be electrically connected to the periphery region 200, and an end of the inner circuit pattern layer 120 may be brought into contact with a connection pattern layer 160.

Referring to FIG. 3, the peripheral conductive pattern layer 212 and the conductive test pattern 214 may be disposed in the periphery region 200. The peripheral conductive pattern layer 212 may include a first pattern portion 212a disposed in the insulation layer 101, a second pattern portion 212b disposed on the upper surface 101a of the insulation layer 101, and a conductive via 212c connecting the first pattern portion 212a to the second pattern portion 212b. The conductive test pattern layer 214 may be disposed on the upper surface 101a of the insulation layer 101 while being electrically connected to the second pattern portion 212b. As illustrated, the conductive test pattern layer 214 may be exposed on the strip substrate 10.

Referring to FIG. 3, the connection pattern layer 160 may be disposed over the unit substrate region 100 and the periphery region 200. The connection pattern layer 160 may be embedded in the insulation layer 101. More specifically, the connection pattern layer 160 may be disposed on the same plane as the inner circuit pattern layer 120 and the first pattern portion 212a while electrically connecting the inner circuit pattern layer 120 to the first pattern portion 212a. The inner circuit pattern layer 120 electrically connected to the blind vias 141 and 142 of FIG. 2 may be electrically connected to the peripheral conductive pattern layer 212.

In other words, the second circuit pattern layer 120 disposed in each unit substrate region 100, may be electrically connected to the peripheral conductive pattern layer 212 of the periphery region 200. Accordingly, the peripheral conductive pattern layer 212 may function as a common electrode pattern layer to provide the same electrical potential to the second circuit pattern layers 120 of each unit substrate region at the same time.

Figure 4:
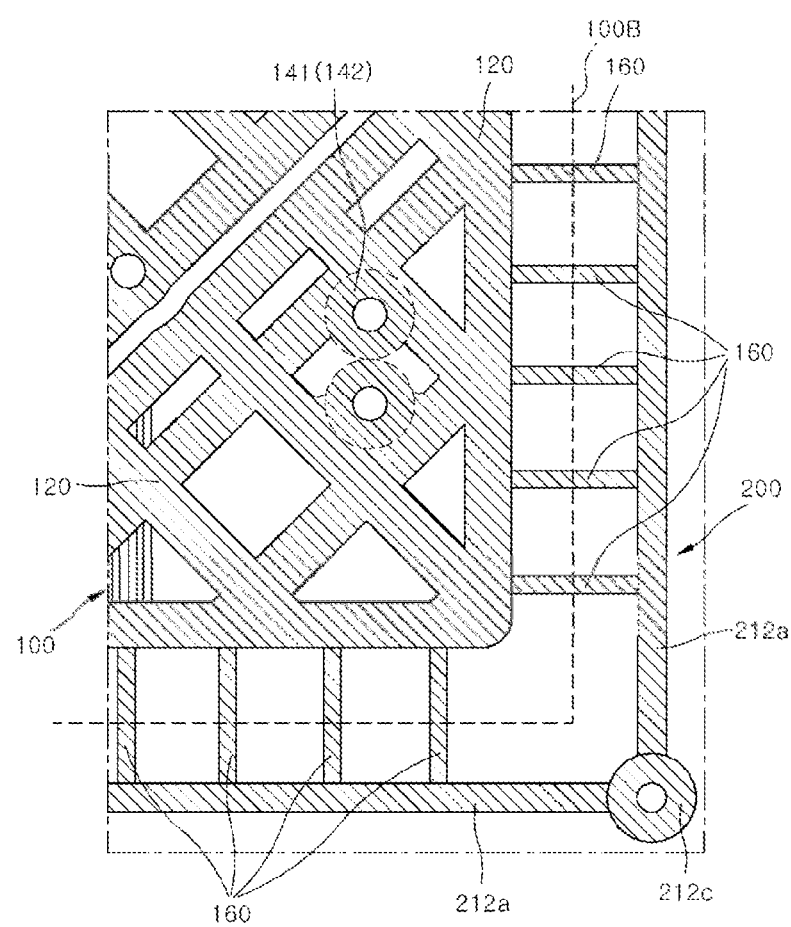
FIG. 4 is a plan view schematically illustrating inner circuit pattern layers of a strip substrate according to an embodiment.

FIG. 4 is a plan view schematically illustrating the inner circuit pattern layers of the strip substrate according to an embodiment of the present disclosure. FIG. 4 may be an enlarged view of an inner circuit pattern layer at the boundary region of the unit substrate region 100 and the periphery region 200. FIG. 4 may be an example of a partial plan view of the inner circuit pattern layer 120 of the strip substrate 10, the first pattern portion 212a and the conductive via 212c of the peripheral conductive pattern layer 212, and the connection pattern layer 160 that are described above with respect to FIGS. 1 to 3. The boundary 100B is illustrated to identify the unit substrate region 100 and the periphery region 200.

As illustrated, the inner circuit pattern layer 120 may be electrically connected to the blind vias 141 and 142. The inner circuit pattern layer 120 may be connected to the first pattern portion 212a of the peripheral conductive pattern layer 212 by a plurality of the connection pattern layers 160 disposed along the boundary of the unit substrate region 100. The first pattern portion 212a may have a line shape disposed along the periphery region 200, and may be electrically connected to the second pattern portion (not illustrated) through the conductive via 212c.

Figure 5:
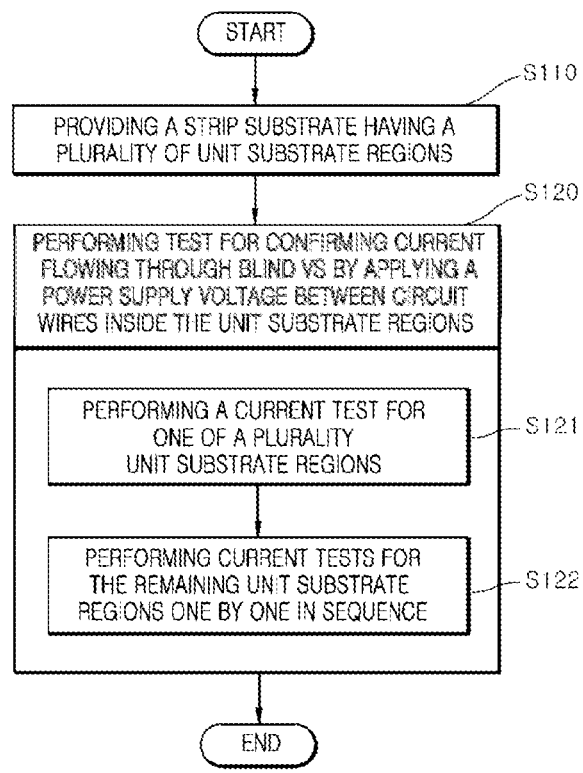
FIG. 5 is a flow chart schematically illustrating a method of testing a printed circuit board having blind vias according to an embodiment.

FIG. 5 is a flow chart schematically explaining the method of testing an electric current of a printed circuit board having blind vias according to an embodiment. Referring to FIG. 5, the electric current of a printed circuit board having blind vias may be tested by going through several steps S110, S120, S121, and S122.

In the step S110, a strip substrate including a plurality of unit substrate regions having blind vias may be provided. In an embodiment, the strip substrate may be the same as the strip substrate 10 of the embodiment described above with respect to FIGS. 1 to 4. That is, the plurality of unit substrate regions may be spaced apart from each other by interposing the periphery region therebetween. Peripheral conductive pattern layers may be disposed in the periphery region. The peripheral conductive pattern layer and the blind vias may be electrically connected to each other by the connection pattern layer. In other words, the peripheral conductive pattern layer may be electrically connected in common to the blind vias of the plurality of unit substrate regions. Accordingly, the peripheral conductive pattern layer may function as a common electrode pattern layer that provides the same electrical potential to the blind vias of the plurality of unit substrate regions. The connection pattern layer may be disposed on the same plane as the inner circuit pattern layers of the unit substrate region that are in contact with the blind vias. The connection pattern layer may extend to the peripheral conductive pattern layer.

The peripheral conductive pattern layer may include a first pattern portion disposed on the same plane as the connection pattern layer, and a second pattern portion electrically connected to the first pattern portion by a conductive via and disposed on a surface of an insulation layer covering the first pattern portion.

In the step S120, whether an electric current can flow through circuit wires that pass through the blind vias in the unit substrate regions is tested by applying a voltage between the circuit wires. In an embodiment, the electrical current test may be performed by bringing an electricity meter into contact with test pads that extend from the circuit wires and are exposed on the both surfaces of the strip substrate. In an embodiment, as illustrated in FIG. 2, the first connection pad 110P and the second connection pad 130P may be defined as test pads, and a probe of the electricity meter may be brought into contact with the test pads. The electric current test with respect to the conductivity of the circuit wire may be performed by measuring an electric current that flows from the first connection pad 110P and to the second connection pad 130P through the first blind via 141, the inner circuit pattern layer 120, and the second blind via 142.

According an embodiment, the electric current test may be performed as follows. In the step S121, the electric current test may be performed for one of the plurality of unit substrate regions. In step S122, the electric current test for the rest of the plurality of unit substrate regions may be sequentially performed. In an embodiment, the electric current test may be performed only for one unit substrate region at a time, and therefore the number of the electric current test may be the same as the number of the unit substrate region. The method of performing the electric current test may result from the configuration of the printed circuit board according to an embodiment of the present disclosure, as described below.

Referring to FIGS. 1 to 4, the inner circuit pattern layer 120 of a plurality of unit substrate regions 100 may be electrically connected to the peripheral conductive pattern layers 212, respectively. The peripheral conductive pattern layer 212 may electrically connect the inner circuit pattern layers 120 of a plurality of unit substrate regions 100 at the same time. Accordingly, if the electric current tests for at least two unit substrate regions are performed at the same time, the reliability of the result of the electric current tests for the electrical path via the blind vias located within a single unit substrate region may decrease. It' because, where two or more unit substrate regions are electrically connected to each other through the peripheral conductive pattern layer 212, a conductive path that does not pass through the blind via may be formed among the first connection pads 110P and the second connection pads 130P. This phenomenon will be more specifically described below with reference to FIGS. 6 and 7.

Figure 6:
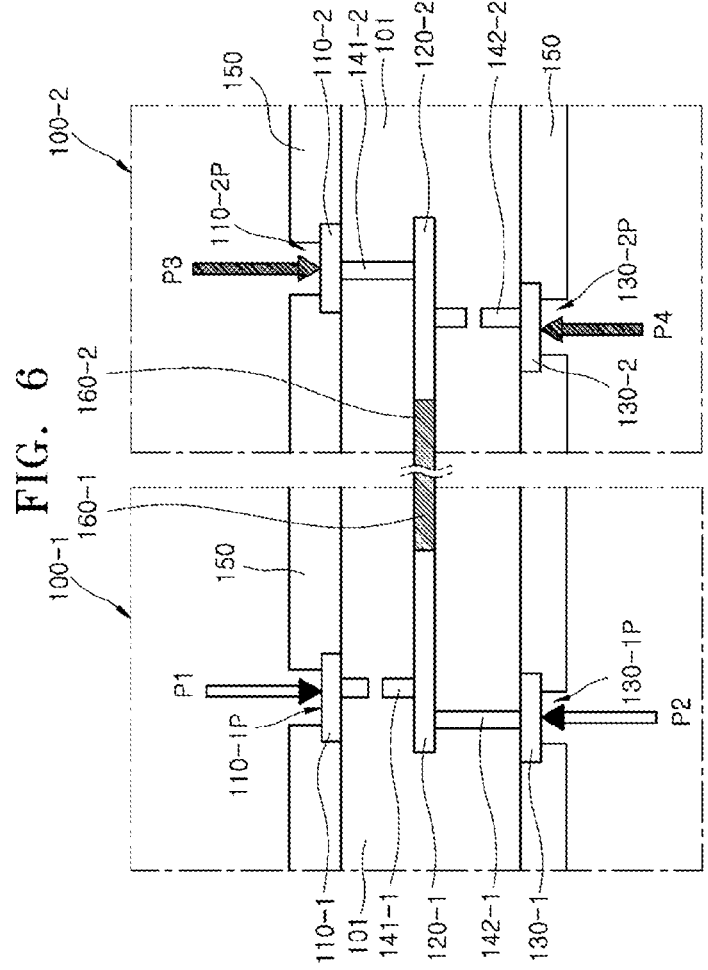
FIG. 6 is a schematic diagram illustrating a method of testing the electrical conduction for a plurality of unit substrate regions according to a comparison example.
Figure 7:
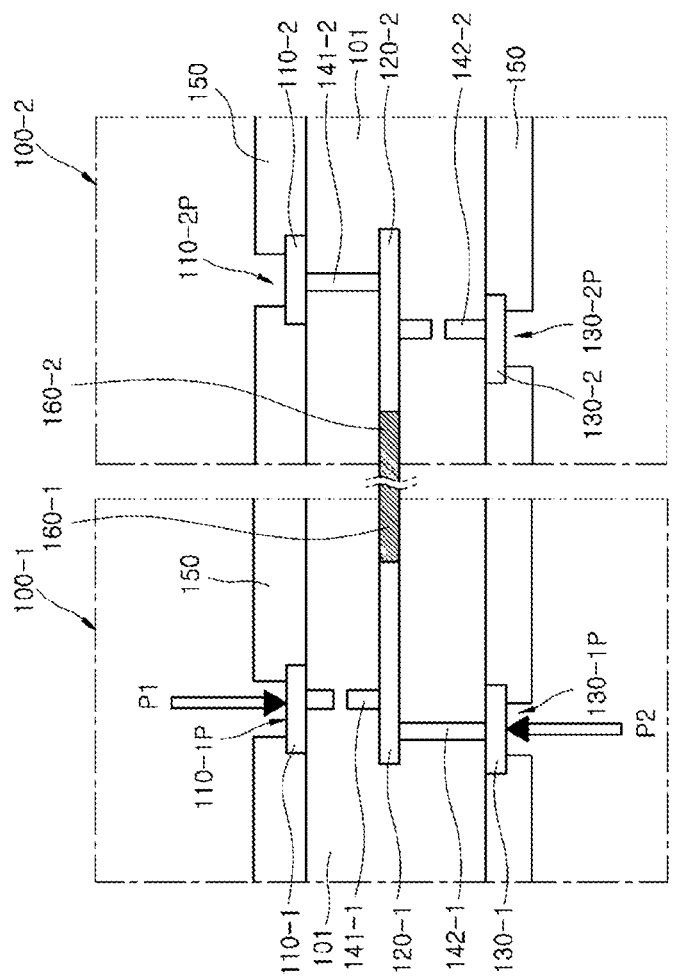
FIG. 7 is a schematic diagram illustrating a method of testing the electrical conduction for a plurality of unit substrate regions according to an embodiment.

FIG. 6 is a schematic diagram illustrating an electric current test method for a plurality of unit substrate regions according to an example for a comparison with various embodiments of the present invention, and FIG. 7 is a schematic diagram illustrating an electric current test method for a plurality of unit substrate regions according to an embodiment. In FIGS. 6 and 7, the printed circuit boards on which the electrical electric current test is carried out may be the same as the printed circuit boards described with respect to FIGS. 1 to 4.

Referring to FIG. 6, electric current tests for a first unit substrate region 100-1 and a second unit substrate region 100-2 may be performed at the same time. To this end, first and second probes P1 and P2 of the electricity meter are brought into contact with first and second connection pads 110-1P and 130-1P of the first unit substrate region 100-1. Also, third and fourth probes P3 and P4 of the electricity meter are brought into contact with first and second connection pads 110-2P and 130-2P of the second unit substrate region 100-2, respectively.

At this time, the inner circuit pattern layer 120-1 that is in contact with the first and second blind vias 141-a and 142-1 of the first unit substrate region 100-1 may be electrically connected to the peripheral circuit pattern layer (not illustrated) by the connection pattern layer 160-1. The inner circuit pattern layer 120-2 that is in contact with the first and second blind vias 141-2 and 142-2 of the second unit substrate region 100-2 may be electrically connected to the periphery circuit pattern layer (not illustrated) by the connection pattern layer 160-2.

On the other hand, the first blind via 141-1 of the first unit substrate region 100-1 and the second blind via 142-2 of the second unit substrate region 100-2, which are not normally formed, may form an open circuit. Accordingly, it should be detected as "defective" because the electrical path between the first connection pads 110-1P and 110-2P and the second connection pads 130-1P and 130-2P have not been electrically connected. However, if the electric current tests are performed at the same time on the first unit substrate region 100-1 by using the first and second probes P1 and P2 and on the second unit substrate region 100-2 are performed by using the third and fourth probes P3 and P4, an electrical current may appear to flow between the first connection pad 110-1P and the second connection pad 130-1P in the first unit substrate region 100-1 and between the first connection pad 110-2P and the second connection pad 130-2P in the second unit substrate region 100-2. Although the first blind via 141-1 of the first unit substrate region 100-1 and the second blind via 142-2 of the second unit substrate region 100-2 have formed an open circuit, the conductive path may be formed between two or more of the second connection pad 130-1P, the second blind via 142-1, the inner circuit pattern layer 120-1, the connection pattern layer 160-1, the peripheral conductive pattern layer, the connection pattern layer 160-2 of the first unit substrate region 100-2, the first blind via 141-2, and the first connection pad 110-2P.

In contrast, as illustrated in FIG. 7, the electric current test in accordance with an embodiment of the present disclosure is performed for one unit substrate region at a time. In an embodiment, a power supply coupled between the first connection pad 110-2P and the second connection pad 130-2P of the second unit substrate region 100-2 may be turned-off during the electric current test for the first unit substrate region 100-1. In an embodiment of FIG. 7, where the inner circuit pattern layer 120-1 of the first unit substrate region 100-1 is electrically connected to the peripheral conductive pattern layer through the connection pattern layer 160-1, even if the inner circuit pattern layer 120-1 of the first unit substrate region 100-1 is electrically connected to two or more inner circuit pattern layers of different unit substrate region at the same time, an electrical current is actually measured only between the first connection pad 110-1P and the second connection pad 130-1P by using the first and second probes P1 and P2. Accordingly, the reliability of the electric current test for measuring an electric current between the first connection pad 110-1P and the second connection pad 130-1P in the first unit substrate region 110-1 may increase because it reflects whether or not the first blind via 141-1 and the second blind via 142-1 are normally formed.

As described above, the electric current test according to an embodiment of the present disclosure may be performed only for one unit substrate region at a time, and when testing a plurality of unit substrate regions, the electric current test is sequentially performed a number of times corresponding to the number of the unit substrate regions.

Figure 8:
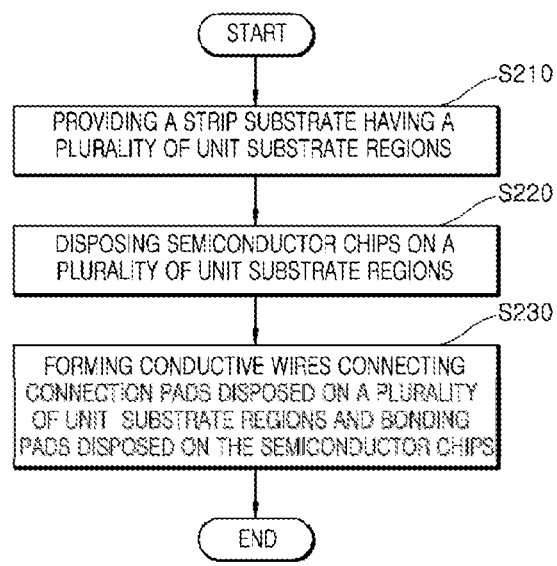
FIG. 8 is a flow chart schematically illustrating a method of manufacturing a semiconductor package having blind vias according to an embodiment.

FIG. 8 is a flow chart schematically illustrating a method of manufacturing the semiconductor package having blind vias according to an embodiment. Referring to FIG. 8, the semiconductor package having blind vias may be manufactured through several steps S210, S220, and S230. In the step S210, a strip substrate including a plurality of unit substrate region each having blind vias is provided. In an embodiment, the strip substrate is the same as the strip substrate 10 of the various embodiments described above with reference to FIGS. 1 to 4.

In other words, the unit substrate regions may be spaced apart from each other by interposing the periphery region therebetween. A peripheral conductive pattern layer may be disposed in the periphery region. The peripheral conductive pattern layer and the blind via may be electrically connected to each other by the connection pattern layer. In other words, the peripheral conductive pattern layer may be connected in common to the blind vias of a plurality of unit substrate regions.

The connection pattern layer may be disposed on the same plane as the inner circuit pattern layers of the unit substrate region that are in contact with the blind vias. The connection pattern layer may extend to the peripheral conductive pattern layer. The periphery pattern layer may include a first pattern portion disposed on the same plane as the connection pattern layer, and a second pattern portion, which is electrically connected to the first pattern portion by a conductive via and exposed on the strip substrate.

In the step S220, semiconductor chips may be disposed on the plurality of unit substrate regions. In an embodiment, this step S220 involves mounting the semiconductor chips on the strip substrate.

In the step S230, conductive wires may get connected to the connection pad disposed on the plurality of unit substrate region and a bonding pad disposed on the semiconductor chip may be formed. Although it is not illustrated, a molding member covering the semiconductor chip, the bonding pad, and the conductive wire may be formed on a surface of the strip substrate. Then, a plurality of unit substrate regions separated from the strip substrate by sawing the periphery region. As a result, unit packages are obtained from the strip substrate.

In some embodiments, before the step S220, an electric current test for the at least one blind via may be further performed. The electric current test may be performed by applying a voltage across the circuit wires in the unit substrate region via the blind via. Also, the electric current test may be performed by applying a voltage across the test pads that are electrically connected to the circuit wires and are exposed on both surfaces of the unit substrate region. The electric current test may be individually performed for the plurality of unit substrate regions, and may be sequentially performed for the plurality of unit substrate regions. The electric current test described above may be the same as the electric current test for the printed circuit board described above with respect to FIG. 5.

Figure 9:
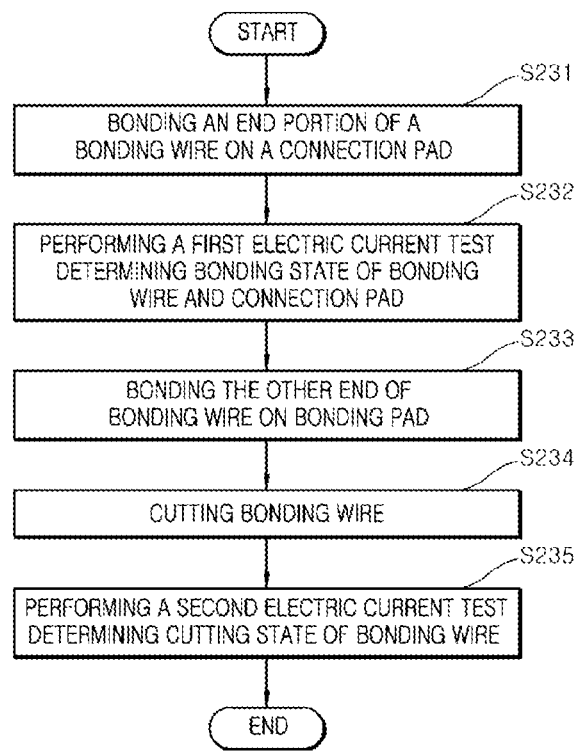
FIG. 9 is a flow chart schematically illustrating a method of forming a conductive wire between a printed circuit board having blind vias and a semiconductor chip according to an embodiment.

FIG. 9 is a flow chart schematically illustrating a method of forming a conductive wire between the printed circuit board having blind vias and a semiconductor chip according to an embodiment. This method of forming the conductive wire involves several steps S231 to S235, which may be applicable to the step S230 described in connection with FIG. 8. The conductive-wire-forming process may be performed on the strip substrate 10, which has been described above in connection with FIGS. 1 to 4, using a wire bonding apparatus that provides bonding wires.

Referring to FIG. 9, in the step S231, an end portion of the bonding wire may be bonded to the connection pad. In the step S231, a first electric current test for determining a bonding state (e.g., whether the end portion of the bonding wire has been properly connected to the connection pad may be performed). The first electric current test may include a step to verify a conducting state across the electric circuits formed inside the plurality of unit substrate regions via the connection pads and the bonding wires. If the electric circuit is a short circuit, the bonding state is determined to be good. In the step S233, the other end portion of the bonding wire may be bonded to the bonding pad. In the step S234, the bonding wire may be cut. In the step S235, a second electric current test may be performed to determine a cutting state of the bonding wire (e.g., whether the bonding wire has been cut). The second electric current test may include a step to verify the conducting state across the electric circuits formed inside the plurality of unit substrate region via the bonding portion of the connection pads and the bonding wires. If the electric circuit is an open circuit, the cutting state of the bonding wire is determined to be good.

As described above, the first and the second electric current tests in accordance with various embodiments may be performed in the formation of the conductive wires. Also, it is possible to effectively test whether or not an electrical connection between the bonding wires and the connection pads, and between the bonding wires and the bonding pads are formed.

Figure 10:
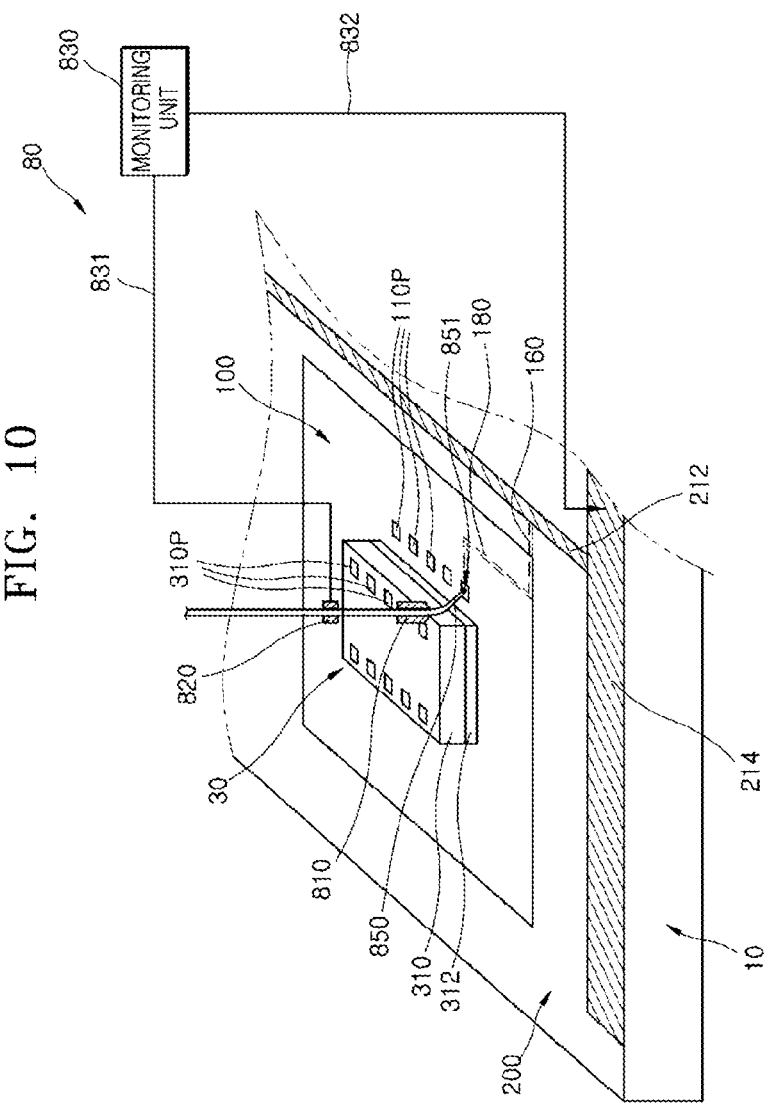
FIGS. 10 and 11 are schematic diagrams illustrating a method of forming a conductive wire according to an embodiment.
Figure 11:
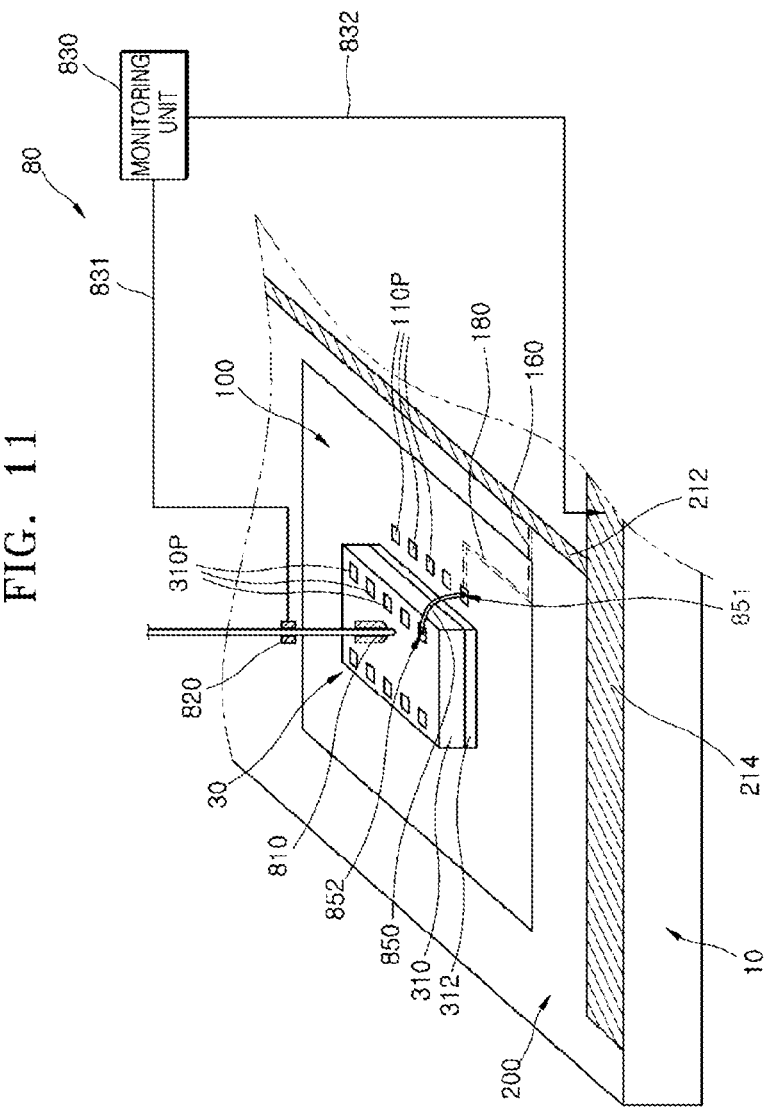

FIGS. 10 and 11 are schematic diagrams illustrating a method of forming a conductive wire according to an embodiment. FIGS. 10 and 11 may be an example embodiment of the conductive wire formation method described above in connection with FIG. 9.

Referring to FIG. 10, a strip substrate 10 may be provided. A semiconductor chip 30 may be disposed on the unit substrate region 100 of the strip substrate 10. The semiconductor chip 30 may be disposed so that a body portion 310 is bonded on the upper surface of the strip substrate 10 by an adhesive layer 312. The semiconductor chip 30 may be disposed to be adjacent to the connection pad 110P on the strip substrate 10.

On the other hand, the unit substrate region where the semiconductor chip 30 is disposed may include valid blind vias verified by the electric current test described above with respect to the flow chart of FIG. 5. The connection pads 110P may be electrically connected to the peripheral conductive pattern layer 212 through the inner connection wires 180 and connection pattern layers 160 inside the unit substrate region 100. The connection wires 180 may include the blind vias 141 and 142 and the inner circuit pattern layer 120 illustrated in FIGS. 1 to 3. The peripheral conductive pattern layer 212 may be electrically connected to the test pattern layer 214.

Referring back to FIG. 10, a wire bonding apparatus 80 may be provided. The wire bonding apparatus 80 may include a capillary 810 transporting the bonding wire 850 to a predetermined location, a wire clamp 820 clamping the bonding wire 850, and a monitoring unit 830 verifying the bonding state of the bonding wire 850. The monitoring unit 830 may connect a first and second signal applying wires 831 and 832 to the wire clamp 820 and the test pattern 214, respectively. The monitoring unit 830 may apply a voltage to the wire clamp 820 and the test pattern 214 through the first and the second signal applying wire 831 and 832. In an embodiment, the monitoring unit 830 may apply a voltage across the test pattern 214 and the wire clamp 820. The test pattern 214 may be grounded.

The capillary 810 may bond an end portion of the bonding wire 850 on the connection pad 110P, and thus a first bonding portion 851 may be formed. Then, the capillary 810 may extend the bonding wire 850 to the top of the first bonding portion 851. At this time, the extended bonding wire 850 may maintain its electrical connection to capillary 810. The monitoring unit 830 may apply a voltage across the wire clamp 820 and the test pattern 214 through the first and the second signal applying line 831 and 832, and thus the first electric current test may be performed.

In the first electric current test, if the bonding wire 850 and the connection pad 110P of the first bonding portion 851 maintain an electrical connection therebetween, the current flows through the electric circuit that starts from the first signal applying line 831 and ends at the second signal applying line 832 through the wire clamp 820, bonding wire 850, the first bonding portion on the connection pad 110P, the connection wire 180, the connection pattern layer 160, the peripheral conductive pattern layer 212, and the test pattern layer 214. If an electrical connection between the bonding wire 850 and the connection pad 110P of the first bonding portion 851 has been lost, however, the current doesn't flow through the electric circuit. The monitoring unit 830, therefore, can selectively test the bonding state of the bonding pad 110P and the bonding wire 850 by measuring the current flowing through the electric circuit.

Referring to FIG. 11, if the bonding state of the first bonding portion is determined to be good by the monitoring unit 830, the capillary 810 may continuously extend the bonding wire 850 and may bond the other end portion of the bonding wire 850 to the bonding pad 310P of the semiconductor chip 30. The bonding wire 850 and the bonding pad 310P may be bonded, and thus the second bonding portion 852 may be formed. Then, the wire clamp 820 may cut the bonding wire 850. The monitoring unit 830 may perform the second electric current test, which determines the cutting state of the bonding wire 850, by applying the voltage across the wire clamp 820 and the test pattern 214 by the first and the second signal applying lines 831 and 832.

In the second electric current test, if the bonding wire 850 is not completely cut after being bonded to the second bonding portion 852 and maintain its electrical connection to the second bonding portion 852, the current flows through the electric circuit that starts from the first signal applying line 831 and ends at the second signal applying line 832 through the wire clamp 820, bonding wire 850, the first bonding portion on the connection pad 110P, the connection wire 180, the connection pattern layer 160, the peripheral conductive pattern layer 212, and the test pattern layer 214.

On the other hand, in the second electric current test, if the bonding wire 850 is completely cut after being bonded to the second bonding portion 852, the current does not flow through the electric circuit that starts from the first signal applying line 831 and ends at the second signal applying line 832 through the wire clamp 820, bonding wire 850, the first bonding portion on the connection pad 110P, the connection wire 180, the connection pattern layer 160, the peripheral conductive pattern layer 212, and the test pattern layer 214.

The monitoring unit 830, therefore, can electively test the cutting state of the bonding wire 850 on the bonding pad 110P by determining the current flow through the electric circuit.

As described above, according to various embodiments of the present disclosure, in the process of forming the bonding wire, it is possible to improve the reliability of the wire bonding step of the semiconductor packaging process by performing the electric current test for the electrical path that starts from the bonding wire and ends at the peripheral conductive pattern layer through the unit substrate region.

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A method of manufacturing a semiconductor package, the method comprising:
   providing a strip substrate having a plurality of unit substrate regions that are spaced apart from each other by a periphery region and have blind vias, a peripheral conductive pattern layer disposed in the periphery region, and a connection pattern layer electrically connecting the blind vias to the peripheral conductive pattern layer;
   mounting semiconductor chips on the plurality of unit substrate regions; and
   forming conductive wires electrically connecting connection pads disposed on the plurality of unit substrate regions to bonding pads disposed on the semiconductor chips,
   wherein the connection pads are electrically connected to the blind vias, and
   wherein forming the conductive wires includes performing a test for confirming a current that flows between each conductive wire and the peripheral conductive pattern layer through the plurality of unit substrate regions.

2. The method of claim 1, wherein the strip substrate of the unit substrate region comprises an insulation layer, an inner circuit pattern layer disposed in the insulation layer, and a first and a second outer circuit pattern layers disposed on a first and a second surfaces of the insulation layer, and wherein the inner circuit pattern layer electrically connects the blind via and the connection pattern layer.

3. The method of claim 1, wherein the strip substrate of the unit substrate region includes multi-layered circuit pattern layers, and wherein the connection pattern layer is disposed on the same plane as the inner circuit pattern layer in contact with the blind via of the multi-layered circuit pattern layers.

4. The method of claim 1, further comprising:
   applying a voltage across circuit wires in the unit substrate regions through the blind via; and
   performing an electric current test for the circuit wires before the step of disposing semiconductor chips on the plurality of unit substrate regions.

5. The method of claim 4, wherein performing the electric current test for the circuit wires comprises applying a voltage to the circuit wires by bringing a probe of the tester into contact with the test pads electrically connected to the circuit wires and exposed on both surfaces of the strip substrate.

6. The method of claim 5, wherein performing the electric current test for the circuit wires comprises performing an electric current test for one unit substrate region on the plurality of unit substrate regions, and performing an electric current test for the rest of the unit substrate regions of the plurality of unit substrate regions one by one.

7. The method of claim 4, wherein the peripheral conductive pattern layer is electrically connected in common to the blind vias of the plurality of unit substrate regions.

8. The method of claim 1, wherein the connection pattern layer is disposed on the same plane as the inner circuit pattern layer of the unit substrate region in contact with the blind via.

9. The method of claim 1, wherein the peripheral conductive pattern layer comprises:
   a first pattern portion disposed on the same plane as the connection pattern layer; and
   a second pattern portion electrically connected to the first pattern portion by a conductive via and disposed on a surface of the insulation layer covering the first pattern portion.

10. The method of claim 1, wherein forming the conductive wire comprises performing a first electric current test determining a bonding state between the end portion of the bonding wire and the connection pad, and
   wherein performing the first electric current test comprises verifying a conduction state of the electric circuits formed inside the unit substrate region through the bonding wire and a bonding portion of the connection pad.

11. The method of claim 10, wherein performing the first electric current test comprises verifying the conduction state of the electric circuits formed inside the unit substrate region through the bonding wire and the bonding portion of the connection pad.

12. The method of claim 10, further comprising:
   bonding the other end portion of the bonding wire on the bonding pad;
   cutting the bonding wire; and
   performing a second electric current test determining a cutting state of the bonding wire, and
   wherein performing the second electric current test comprises verifying the conduction state of the electric circuits formed inside the unit substrate region through the bonding wire and the bonding portion of the connection pad.

13. The method of claim 12, wherein performing the second electric current test comprises verifying the conduction state of the electric circuits formed inside the unit substrate region through the bonding wire and the bonding portion of the connection pad.

14. A method of testing a printed circuit board, the method comprising:
provided a strip substrate having a plurality of unit substrate regions that are spaced apart from each other by a periphery region, a peripheral conductive pattern layer disposed in the periphery region, and a connection pattern layer electrically connecting the peripheral conductive pattern layer to at least one blind via included in each of the plurality of unit substrate regions; and
performing a test for measuring a current flowing through each of the blind vias by applying a voltage across circuit wires electrically connected to the blind vias and disposed in the unit substrate regions,
wherein the peripheral conductive pattern layer is electrically connected to the blind vias of the plurality of unit substrate regions in common, and
wherein performing the test comprises performing an electric current test for measuring a current flowing through the blind via included in any one of the plurality unit substrate regions and sequentially performing the electric current test on remaining unit substrate regions.

15. The method of claim 14, wherein performing the electric current test comprises applying a voltage to the circuit wires by bringing probes of a tester into contact with test pads that are electrically connected to the circuit wires and exposed on both edges of the strip substrate.

16. The method of claim 15, wherein:
the connection pattern layer is disposed on the same plane as the inner circuit pattern layer of the unit substrate region;
the inner circuit pattern layer is in contact with the blind via; and
the connection pattern layer extends to the peripheral conductive pattern layer.

17. The method of claim 16, wherein the peripheral conductive pattern layer comprises:
a first pattern portion disposed on the same plane as the connection pattern layer; and
a second pattern portion electrically connected to the first pattern portion by the conductive via and disposed on a surface of an insulation layer covering the first pattern portion.

* * * * *